(12) United States Patent  (10) Patent No.: US 8,954,306 B2
Li et al.  (45) Date of Patent: Feb. 10, 2015

(54) COMPONENT BEHAVIOR MODELING USING SEPARATE BEHAVIOR MODEL

(75) Inventors: Junjun Li, Williston, VT (US); Rahul Nayak, Bhopal (IN)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 12/826,958

(22) Filed: Jun. 30, 2010

(65) Prior Publication Data

US 2012/0004896 A1 Jan. 5, 2012

(51) Int. Cl.
*G06G 7/48* (2006.01)
*G06F 17/50* (2006.01)

(52) U.S. Cl.
CPC ........ *G06F 17/5036* (2013.01); *G06F 17/5022* (2013.01); *G06F 17/5068* (2013.01); *G06F 17/5045* (2013.01)
USPC ................................................ 703/14; 703/4

(58) Field of Classification Search
CPC ............ G06F 17/5045; G06F 17/5068; G06F 17/5022
USPC ...................................................... 703/14, 4
See application file for complete search history.

(56) References Cited

U.S. PATENT DOCUMENTS

| 5,949,694 | A | 9/1999 | Amerasekera et al. |
| 6,493,850 | B2 | 12/2002 | Venugopal et al. |
| 7,024,646 | B2 * | 4/2006 | Logie et al. .................... 716/115 |
| 7,181,352 | B2 | 2/2007 | Iyer et al. |
| 7,184,253 | B1 * | 2/2007 | Hartranft et al. ............... 361/111 |
| 7,268,003 | B2 | 9/2007 | Hayashi |
| 7,302,378 | B2 | 11/2007 | Hayashi |
| 7,434,179 | B2 | 10/2008 | Hayashi |
| 8,115,343 | B2 | 2/2012 | Sanders et al. |
| 2005/0065762 | A1 | 3/2005 | Hayashi |
| 2007/0045656 | A1 | 3/2007 | Chen |
| 2007/0139031 | A1 * | 6/2007 | Park et al. ................... 324/76.11 |

(Continued)

FOREIGN PATENT DOCUMENTS

| EP | 1464968 A2 | 10/2004 |
| JP | 2001339052 A | 12/2001 |

(Continued)

OTHER PUBLICATIONS

Abhishek Ramanujan, NPL publication, "Modeling IC Snapback Characteristics Under Electrostatic Discharge Stress", Nov. 2009.*

(Continued)

*Primary Examiner* — Omar Fernandez Rivas
*Assistant Examiner* — Angel Calle
(74) *Attorney, Agent, or Firm* — Anthony J. Canale; Hoffman Warnick LLC

(57) ABSTRACT

A behavior model is provided, which is configured to simulate one aspect of the behavior of a component apart from the component model for the component. The behavior model can be included in a circuit model used to simulate operation of a circuit. The circuit model can include a component model for a component and a corresponding behavior model, which is located in parallel or series with the component model. The component model and behavior model can collectively simulate all of the behavior of the component within the circuit. In an embodiment, the behavior model simulates snapback behavior exhibited by the component.

25 Claims, 7 Drawing Sheets

(56) References Cited

U.S. PATENT DOCUMENTS

| | | | |
|---|---|---|---|
| 2009/0039869 A1 | 2/2009 | Williams | |
| 2009/0044158 A1 | 2/2009 | Lilja | |
| 2009/0268361 A1 | 10/2009 | Mallikarjunaswamy | |
| 2011/0016440 A1* | 1/2011 | Bergmann et al. | 716/106 |

FOREIGN PATENT DOCUMENTS

| | | |
|---|---|---|
| JP | 2004079952 A | 3/2004 |
| JP | 2005093802 A | 4/2005 |

OTHER PUBLICATIONS

Yuanzhong (Paul) Zhou, , NPL publication, "Modeling Snapback and Rise-Time effects in TLP Testing for ESD MOS Devices Using BSIM3 and VBIC Models", May 2005.*

Yuanzhong (Paul) Zhou, NPL publication, "Modeling snapback of LVTSCR Devices for ESD circuit simulation using advanced BJT and MOS models", EOS/ESD symposium 2007.*

Patrick A. Juliano, NPL publication, "A Novel SCR Macromodel for ESD Circuit Simulation", IEEE 2001.*

Yuanzhong (paul), Zhou, NPL, "Modeling MOS snapback for circuit level ESD simulation Uisng BSIM3 and VBIC models", IEEE 2005.*

Jung-Hoon Chun, NPL, "ESD protection circuits for advanced CMOS technologies", 2006.*

Tong, Li, NPL, "Layout Extraction and Verification Methodology for CMOS I/O Circuits", 1998.*

Lu Jia, "A study of snapback and parasitic bipolar action for ESD NMOS modeling", 2007.*

Juliano et al., "A Novel SCR Macromodel for ESD Circuit Simulation", IEDM 2001, pp. 319-322.

Di Sarro et al., "Evaluation of SCR-Based ESD Protection Devices in 90NM and 65NM CMOS Technologies", IEEE, 45th Annual International Reliablity Physics Symposium, Phoenix, 2007 pp. 348-357.

Di Sarro et al., "A Scalable SCR Compact Model for ESD Circuit Simulation", IEEE, 46 th Annual International Reliability Physics Symposium, Phoenix, 2008, pp. 254-261.

Gohler et al., "A Physically Based Parameter Extraction Scheme for SCR Models", 1997 IEEE, pp. 148-153.

Ma et al., "A Physically-Based Lumped-Charge SCR Model", 1993 IEEE, pp. 53-59.

Lou et al., "A Comprehensive Compact SCR Model for CDM ESD Circuit Simulation", IEEE, CDR 46th Annual International Reliability Physics Symposium, Phoenix, 2008, pp. 635-636.

Ramaswamy et al., "Circuit-Level Simulation of CDM-ESD and EOS in Submicron MOS Devices", EOS/ESD Symposium 1996, pp. 316-321.

Zhou et al., "Modeling Snapback of LVTSCR Devices for ESD Circuit Simulation Using Advanced BJT and MOS Models", EOS/ESD Symposium 2007, pp. 175-184.

Lou et al., "Silicon Controlled Rectifier (SCR) Compact Modeling Based on VBIC and Gummel-Poon Models", Solid-State Electronics, vol. 53, Issue 2, Feb. 2009, pp. 195-203, Abstract only.

Vassilev et al., "Snapback Circuit Model for Cascoded NMOS ESD Over-Voltage Protection Structures", 2003 IEEE, pp. 561-564.

Fankhauser et al., "Using Device Simulations to Optimize ESD Protection Circuits" , IEEE, 2004, pp. 963-968.

Nitin Mohan et al., "Modeling ESD Protection", IEEE, 2005, pp. 21-24.

Zhou et al., "Modeling MOS Snapback for Circuit-Level ESD Simulation Using BSIM3 and VBIC Models", Proceedings of the Sixth International Symposium on Quality Electronic Design, 2005, 6 pages.

Chih-Yao Huang, "Simulation prediction of electrothermal behaviors of ESD N/PMOS devices", Solid-State Electronics, vol. 49, pp. 1925-1932, 2005.

Rickelt et al., "A Novel Transistor Model for Simulating Avalanche-Breakdown Effects in Si Bipolar Circuits", IEEE Journal of Solid-State Circuits, vol. 37, No. 9, pp. 1184-1197, Sep. 2002.

Vassilev et al., "MOSFET ESD Breakdown Modeling and Parameter Extraction in Advanced CMOS Technologies", IEEE Transactions on Electron Devices, vol. 53, No. 9, pp. 2108-2117, Sep. 2006.

U.S. Appl. No. 12/652,139, filed Jan. 5, 2010, Li et al.

Michael B. Steer, "Spice (User's Guide and reference)", Edition 1.3, Jul. 2007, 308 pages.

Louis, U.S. Appl. No. 12/652,139, Notice of Allowance, Mar. 14, 2013 10 pages.

Louis, U.S. Appl. No. 12/652,139, Office Action Communication, Aug. 28, 2012, 18 pages.

* cited by examiner

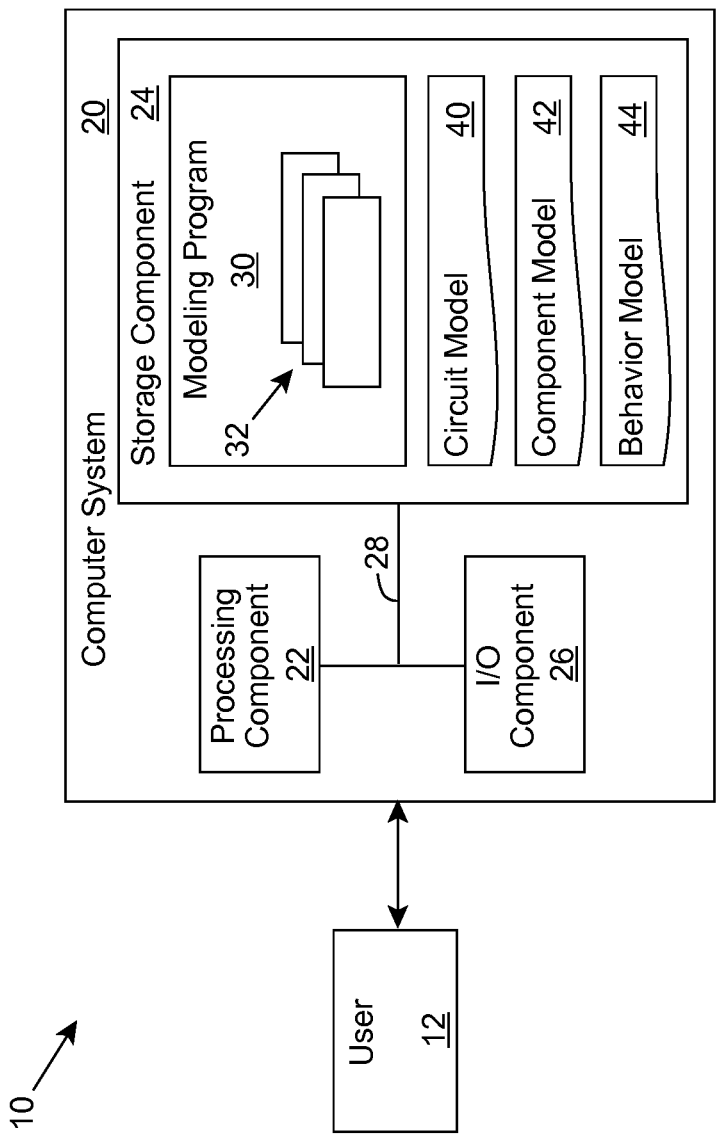

COMPONENT BEHAVIOR MODELING USING SEPARATE BEHAVIOR MODEL

TECHNICAL FIELD

The disclosure relates generally to circuit models (e.g., design structures), and more particularly, to a plug in model for modeling snapback behavior of a circuit component.

BACKGROUND ART

Various semiconductor devices, such as reverse bias diodes, field effect transistors (FETs), such as metal-oxide-semiconductor FETs (MOSFETs), and silicon controlled rectifiers (SCR), exhibit a snapback type of behavior in the current-voltage characteristics. The snapback behavior occurs when a sufficient voltage (i.e., a snapback trigger voltage) is applied across the semiconductor device. The voltage can lead to an avalanche generation of the voltage carriers within the device, which triggers a positive feedback mechanism in the device leading to more and more conduction. The voltage across the device drops to a low value due to a very low dynamic resistance. These devices are often used in electrostatic discharge (ESD) protection circuits because of their voltage snapback and low on state resistance can be used to facilitate discharge of the ESD current away from other components in a circuit.

It is desirable to accurately simulate the behavior of a circuit, including the ESD protection circuit and/or any device(s) exhibiting the snapback behavior, prior to manufacturing the circuit. Accurate simulation provides a better prediction of the behavior of the circuit, and can reduce the number of failures of circuit components due to improper operation, e.g., of the ESD protection circuit under an ESD event. Accurate simulation of a device that exhibits the snapback behavior can enable accurate prediction of the breakdown voltage, the on state resistance, and the pre-snapback behavior of the device. Simulating the positive feedback mechanism within the device exhibiting the snapback behavior can often lead to convergence problems during simulation.

SUMMARY

Aspects of the invention provide a behavior model, which is configured to simulate one aspect of the behavior of a component apart from a component model for the component. The behavior model can be included in a circuit model used to simulate operation of a circuit. The circuit model can include a component model for a component and a corresponding behavior model, which is located in parallel or series with the component model. The component model and behavior model can collectively simulate all of the behavior of the component within the circuit. In an embodiment, the behavior model simulates snapback behavior exhibited by the component.

A first aspect of the invention provides a computer-implemented method comprising: generating a circuit model for a circuit using a computer system including at least one computing device, the generating including: adding a component model for a component of the circuit to the circuit model; and adding a behavior model to the circuit model, wherein the behavior model is located in parallel or in series with the component model, and wherein the behavior model and the component model are configured to collectively simulate the behavior of the component within the circuit; and storing the circuit model on the computer system.

A second aspect of the invention provides a computer-implemented method comprising: obtaining a circuit model for a circuit on a computer system including at least one computing device, the circuit model including a component model for a component of the circuit and a behavior model corresponding to the component model, wherein the behavior model is located in parallel or in series with the component model, and wherein the behavior model and the component model are configured to collectively simulate the behavior of the component within the circuit; and simulating operation of the circuit on the computer system using the circuit model.

A third aspect of the invention provides a computer system comprising: a set of computing devices configured to implement a method comprising: generating a circuit model for a circuit using a computer system including at least one computing device, the generating including: adding a component model for a component of the circuit to the circuit model; and adding a behavior model to the circuit model, wherein the behavior model is located in parallel or in series with the component model, and wherein the behavior model and the component model are configured to collectively simulate the behavior of the component within the circuit.

A fourth aspect of the invention provides a computer system comprising: a set of computing devices configured to implement a method comprising: obtaining a circuit model for a circuit on a computer system including at least one computing device, the circuit model including a component model for a component of the circuit and a behavior model corresponding to the component model, wherein the behavior model is located in parallel or in series with the component model, and wherein the behavior model and the component model are configured to collectively simulate the behavior of the component within the circuit; and simulating operation of the circuit on the computer system using the circuit model.

A fifth aspect of the invention provides a computer program comprising program code embodied in at least one computer-readable storage medium, which when executed, enables a computer system to implement a method comprising: generating a circuit model for a circuit, the generating including: adding a component model for a component of the circuit to the circuit model; and adding a behavior model to the circuit model, wherein the behavior model is located in parallel or in series with the component model, and wherein the behavior model and the component model are configured to collectively simulate the behavior of the component within the circuit.

Other aspects of the invention provide methods, systems, program products, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 1 shows an illustrative environment for modeling a circuit according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION

Figure 2A:
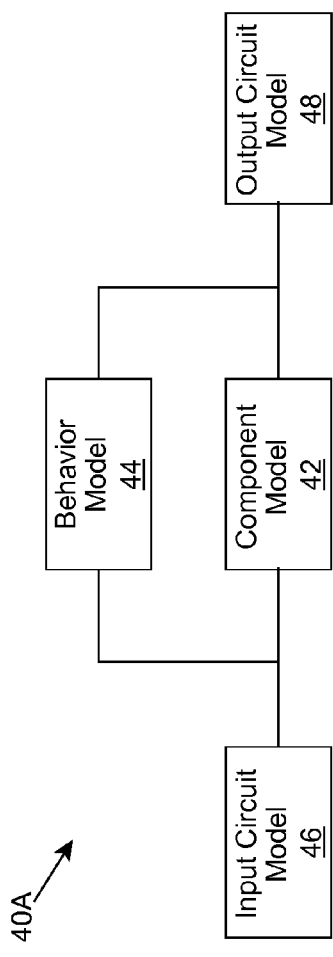
FIGS. 2A and 2B show illustrative circuit models according to embodiments.

As indicated above, aspects of the invention provide a behavior model, which is configured to simulate one aspect of the behavior of a component apart from a component model for the component. The behavior model can be included in a circuit model used to simulate operation of a circuit. The circuit model can include a component model for a component and a corresponding behavior model, which is located in parallel or series with the component model. The component model and behavior model can collectively simulate all of the behavior of the component within the circuit. In an embodiment, the behavior model simulates snapback behavior exhibited by the component. As used herein, unless otherwise noted, the term "set" means one or more (i.e., at least one) and the phrase "any solution" means any now known or later developed solution.

Turning to the drawings, FIG. 1 shows an illustrative environment 10 for modeling a circuit according to an embodiment. Environment 10 includes a computer system 20 that can perform a process described herein in order to simulate the behavior of the circuit. In particular, computer system 20 is shown including a modeling program 30, which makes computer system 20 operable to simulate the behavior of the circuit by performing a process described herein.

Computer system 20 is shown including a processing component 22 (e.g., one or more processors), a storage component 24 (e.g., a storage hierarchy), an input/output (I/O) component 26 (e.g., one or more I/O interfaces and/or devices), and a communications pathway 28. In general, processing component 22 executes program code, such as modeling program 30, which is at least partially fixed in storage component 24. While executing program code, processing component 22 can process data, which can result in reading and/or writing transformed data from/to storage component 24 and/or I/O component 26 for further processing. Pathway 28 provides a communications link between each of the components in computer system 20. I/O component 26 can comprise one or more human I/O devices, which enable a human user 12 to interact with computer system 20 and/or one or more communications devices to enable a system user 12 to communicate with computer system 20 using any type of communications link. To this extent, modeling program 30 can manage a set of interfaces (e.g., graphical user interface(s), application program interface, and/or the like) that enable human and/or system users 12 to interact with modeling program 30. Further, modeling program 30 can manage (e.g., store, retrieve, create, manipulate, organize, present, etc.) the data, such as circuit model 40, using any solution.

In any event, computer system 20 can comprise one or more general purpose computing articles of manufacture (e.g., computing devices) capable of executing program code, such as modeling program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, modeling program 30 can be embodied as any combination of system software and/or application software.

Furthermore, modeling program 30 can be implemented using a set of modules 32. In this case, a module 32 can enable computer system 20 to perform a set of tasks used by modeling program 30, and can be separately developed and/or implemented apart from other portions of modeling program 30. As used herein, the term "component" means any configuration of hardware, with or without software, which implements the actions described in conjunction therewith using any solution, while the term "module" means program code that enables a computer system 20, such as a general purpose computing device, to implement the actions described in conjunction therewith using any solution. When fixed in a storage component 24 of a computer system 20 that includes a processing component 22, a module is a substantial portion of a component that implements the actions. Regardless, it is understood that two or more components, modules, and/or systems may share some/all of their respective hardware and/or software. Additionally, it is understood that some of the functionality discussed herein may not be implemented or additional functionality may be included as part of computer system 20.

When computer system 20 comprises multiple computing devices, each computing device can have only a portion of modeling program 30 fixed thereon (e.g., one or more modules 32). However, it is understood that computer system 20 and modeling program 30 are only representative of various possible equivalent computer systems that may perform a process described herein. To this extent, in other embodiments, the functionality provided by computer system 20 and modeling program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 20 includes multiple computing devices, the computing devices can communicate over any type of communications link. Furthermore, while performing a process described herein, computer system 20 can communicate with one or more other computer systems, such as a system user 12, using any type of communications link. In either case, the communications link can comprise any combination of various types of wired and/or wireless links; comprise any combination of one or more types of networks; and/or utilize any combination of various types of transmission techniques and protocols.

As discussed herein, modeling program 30 enables computer system 20 to simulate behavior of a circuit. To this extent, modeling program 30 is configured to enable computer system 20 to manage circuit model 40, which computer system 20 can process to simulate the behavior of the circuit.

In an embodiment, the circuit model 40 comprises a set of models of components in a circuit and their interconnections. Each component of the circuit can comprise a corresponding component model 42, which can be included within and/or referenced by circuit model 40. Each component model 42 can comprise a set of instructions that can be processed by computer system 20 to simulate one or more parameters of the operation of a corresponding physical embodiment of the component in a circuit. Similarly, circuit model 40 can include a set of instructions that can be processed by computer system 20 to simulate the interconnections of the components of a circuit, various inputs to the circuit, and resulting outputs of the circuit. One or more of the components being modeled using the circuit model 40 can exhibit behavior, such as snapback behavior in the current-voltage characteristics, that is difficult to model using a standard physical model of the component, e.g., a DC model of the component. To this extent, circuit model 40 can include a behavior model 44 corresponding to one or more of these components to model the behavior. Computer system 20 can store the set of instructions for each circuit model 40, component model 42, and behavior model 44 as a file, a set of records in a database, or the like. In an embodiment, computer system 20 can manage a user interface that enables a user 12 to graphically define a circuit model 40 by selecting and connecting one or more component models 42 and behavior models 44.

Figure 2B:
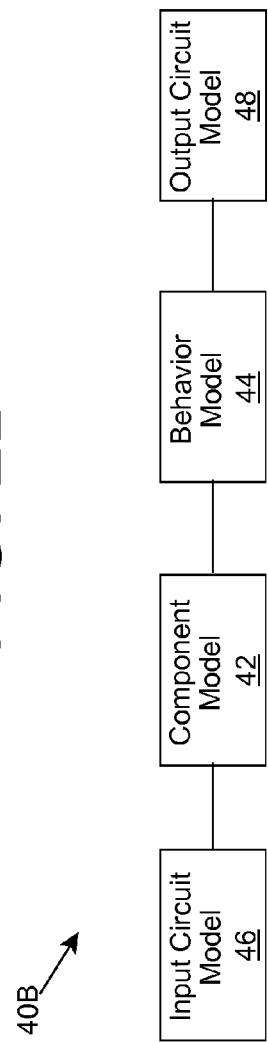

FIGS. 2A and 2B show illustrative circuit models 40A, 40B, respectively, according to embodiments. In circuit model 40A, the behavior model 44 is inserted into the circuit model 40A as a component located in parallel with the component model 42 of the component that exhibits behavior to be modeled separately from the component model 42 using the behavior model 44. In circuit model 40B, the behavior model 44 is inserted into the circuit model 40B as a component located in series with the component model 42 of the component that exhibits the behavior. Each circuit model 40A, 40B also is shown including an input circuit model 46 and an output circuit model 48. The input circuit model 46 can include one or more component models for other components in the circuit 40A, 40B that generate one or more input signals for the component being modeled using component model 42, while the output circuit model 48 can include one or more component models for other components in the circuit 40A, 40B that process one or more output signals generated by the component being modeled using component model 42.

While circuit models 40A, 40B are shown including a single component model 42 and a single behavior model 44, it is understood that any number of component models 42 and/or behavior models 44 can be included in a circuit model 40A, 40B. For example, the behavior of one or more additional components in circuit model 40A, 40B (e.g., a component within input circuit model 46 or output circuit model 48) can be modeled using another instance of the behavior model 44 in parallel or in series with the model for the component. Additionally, multiple behavior models 44 can be used in series and/or in parallel with a single component model 42 or a single behavior model 44 can be used in series or parallel with multiple component models 42. When placed in series with component model(s) 42, the behavior model 44 can be placed before (e.g., on the input circuit model 46 side) or after (e.g., on the output circuit model 48 side) of the component model(s) 42. Still further, it is understood that multiple types of behavior models 44, each of which is configured to model a different type of behavior of a component, can be utilized and included in a circuit model 40A, 40B.

In an embodiment, behavior model 44 is used to simulate the snapback behavior of a component being modeled using component model 42. In this case, in circuit model 40A, the behavior model 44 used to simulate the snapback behavior can act as a very high resistance component (e.g., mega ohms) and therefore be ineffective in the low current operating regime of the component model 42. As a result, the device characteristics of the component model 42 will predominantly define the operation of the parallel configuration of the models 42, 44. In the high current operating regime of the component model 42, the behavior model 44 can act as a very low resistance component (e.g., a few ohms), thereby predominantly defining the operation of the parallel configuration of the models 42, 44. In circuit model 40B, the behavior model 44 can provide a very high resistance in the low current operating regime of the component model 42, and is inactive during the high current operating regime of the component model 42.

Figure 3A:
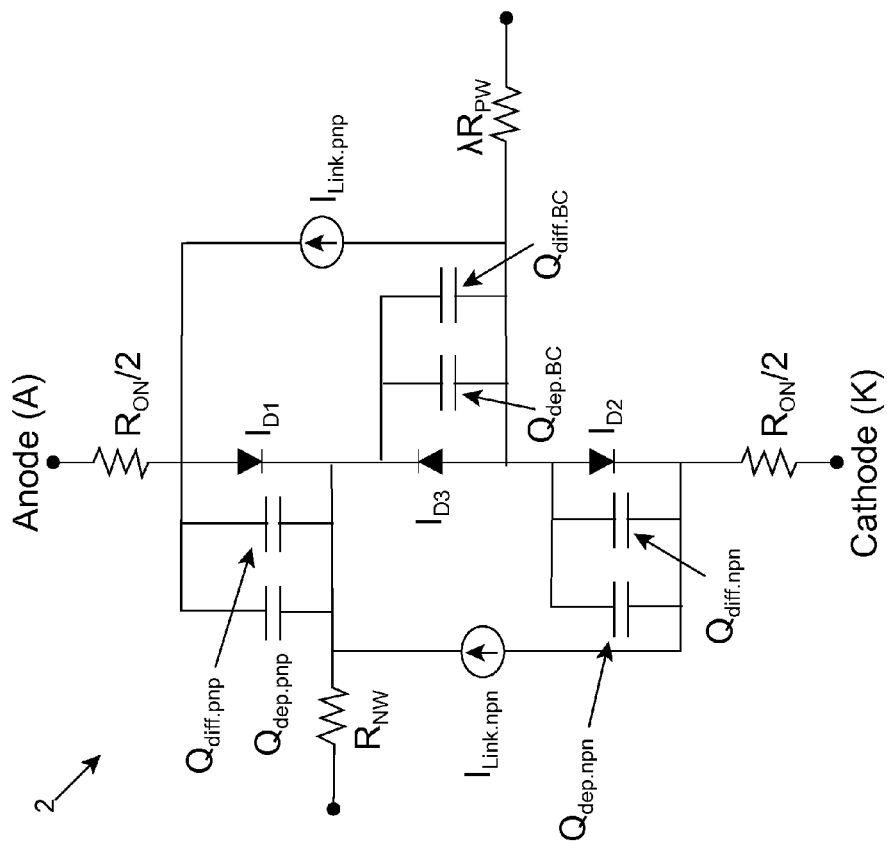
FIGS. 3A and 3B show illustrative DC component models for an SCR and a MOSFET, respectively, according to the prior art.
Figure 3B:
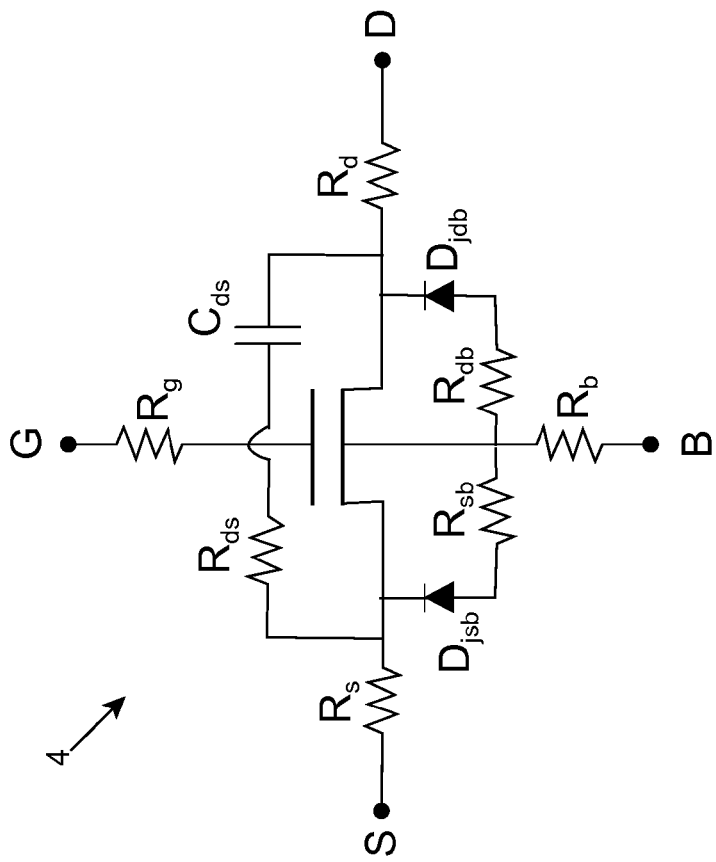

The component model 42 can comprise a typical direct current (DC) component model for the corresponding component and technology (e.g., 90 nm complementary metal-oxide-semiconductor (CMOS) technology, 65 nm CMOS technology, and/or the like). In an embodiment, the DC component model 42 models the component using a physical representation of the component. For example, FIGS. 3A and 3B show illustrative DC component models for an SCR 2 and a MOSFET 4, respectively, according to the prior art. SCR component model 2 comprises a simplification of Ebers-Moll models for the two coupled bipolar junction transistors included in a typical SCR 2. Regardless, the component model 42 can comprise a set of instructions that model the physical operation of the component. To this extent, the set of instructions can comprise one or more component models for sub-components (e.g., resistors, diodes, capacitors, and/or the like) of the component as well as the interconnection data the various sub-components. Similar to circuit model 40 (FIG. 1), computer system 20 can process the component model 42 to simulate operation of the corresponding component, including the operation of each of the sub-component(s), the interconnections of the sub-components, and the generation of a set of outputs, based on a set of inputs to the component model 42.

Figure 5:
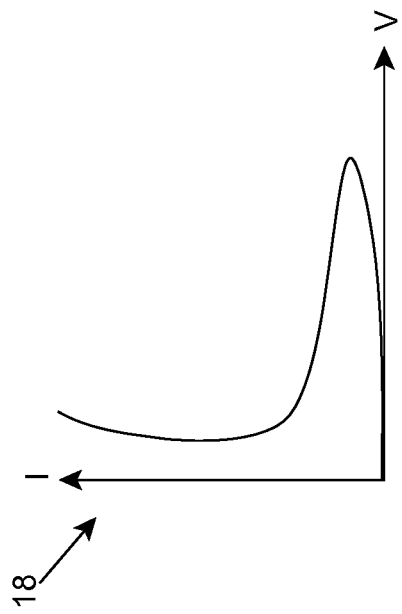
FIG. 5 shows illustrative current-voltage (I-V) characteristics of a hypothetical snapback component according to an embodiment.
Figure 4:
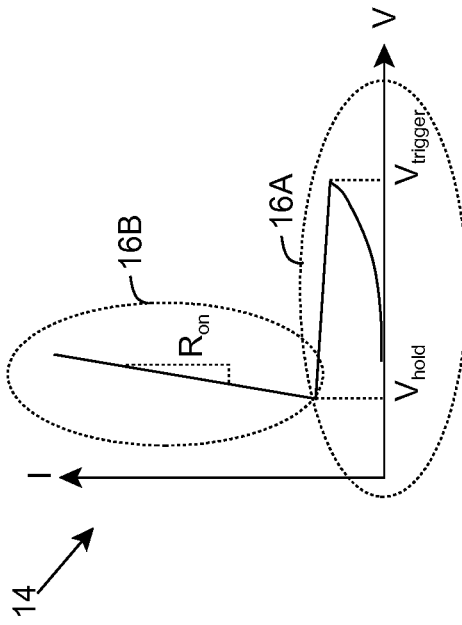
FIG. 4 shows illustrative current-voltage (I-V) snapback characteristics of a component that exhibits snapback behavior according to an embodiment.

In an embodiment, the behavior model 44 captures the snapback and high current turn-on characteristics of the component being modeled using a component model 42. FIG. 4 shows illustrative current-voltage (I-V) snapback characteristics 14 of a component that exhibits snapback behavior according to an embodiment. For example, the I-V snapback characteristics 14 can correspond to a SCR. Region 16A shows the I-V characteristics of the device operation prior to snapback, while region 16B shows the I-V characteristics of the device operation after the snapback voltage, $V_{trigger}$, is exceeded. The holding voltage, $V_{hold}$, is the voltage to which the component voltage snaps back, and the on resistance, $R_{on}$, is the resistance of the component when operating after the snapback. FIG. 5 shows illustrative current-voltage (I-V) characteristics 18 of a hypothetical snapback component modeled using behavior model 44 according to an embodiment. A combination (serial and/or parallel) of the DC component model 42 and the behavior model 44 within a circuit model 40 can be configured to yield the I-V snapback characteristics 14 of the component. For example, a snapback behavior model 44 can be located in parallel between the cathode and anode of the SCR component model 2, in parallel between the drain (D) and source (S) of the MOSFET component model 4, and/or the like. For snapback behavior for which the voltage collapses at high current, a parallel configuration of the component model 42 and the snapback behavior model 44 can be utilized. However, for snapback behavior for which the current collapses as high voltage, a series configuration of the component model 42 and the snapback behavior model 44 can be utilized.

The behavior model 44 can comprise a behavioral model of the behavior being modeled (e.g., snapback), thereby providing a simplified model over a physical model. When implemented with a physical DC component model 42 for the component, the behavior model 44 can maintain the physical nature of the original DC component model 42 and add the behavioral (e.g., snapback) characteristics to the physical component model 42. In an embodiment, the behavior model 44 includes a mathematical formula for modeling the snapback operation of the component being modeled using component model 42. To this extent, the mathematical formula can be selected to maintain continuity between the off state of the component and the on state of the component. For example, the mathematical formula can comprise a functional form that ensures a smooth switch between high current (e.g., above snapback) and low current (e.g., prior to snapback) operation of the component. In a more particular embodiment, the mathematical formula comprises:

$$v = -mag \times [\tan h(pdr \times i)] \times [\tan h(ndr \times (i - i_{hold})) - v_{hold}],$$
where mag is the pre-multiplication factor;

pdr is the positive dynamic resistance (the resistance offered in the blocking portion 6A of the I-V characteristics 4);

ndr is the negative dynamic resistance;

i is the current through the behavior model 44;

$i_{hold}$ is the holding current for the behavior model 44; and $v_{hold}$ is the holding voltage for the behavior model 44.

In this case, the parameters $v_{hold}$, $i_{hold}$, and ndr can be used to control the holding voltage and the holding current values for the behavior model 44, while the parameters pdr and mag can define the positive dynamic resistance offered by the component being modeled using component model 42 before the snapback. To this extent, the mag parameter can be adjusted so that behavior model 44 will have a desired snapback voltage.

One or more parameters for an implementation of the component model 42 and/or the behavior model 44 within a circuit model 40 can be adjusted to provide an accurate simulation of the behavior of a physical embodiment of the component within a circuit. In an embodiment, each model 42, 44 can be configured using measurement data acquired for one or more physical representation(s) of the component. The parameters of each model 42, 44 can be separately fitted to one or more measurements in the measurement data corresponding to the behavior being modeled. Subsequently, the combination of the models 42, 44 can be fitted so that the combined models accurately models all of the behavior attributes of the physical component.

Figure 6:
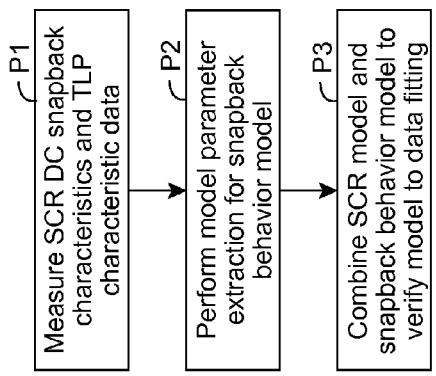
FIG. 6 shows an illustrative process for fitting an illustrative behavior model to the operation parameters for a corresponding component being simulated according to an embodiment.

To this extent, FIG. 6 shows an illustrative process for fitting an illustrative behavior model to the operation parameters for a corresponding component being simulated according to an embodiment. In particular, the behavior model models snapback behavior, and the component comprises an SCR, e.g., being modeled using the SCR component model 2, or the like. Referring to FIGS. 1 and 6, in process P1, computer system 20 can acquire DC snapback characteristic measurement data and transmission line pulse (TLP) characteristic data for the SCR being modeled. In an embodiment, a physical SCR is connected in the breakdown configuration, so that the anode terminal of the SCR is electrically connected directly to the n-well contact, and the cathode terminal of the SCR is electrically connected directly to the p-well contact. In this configuration, computer system 20 can perform a current force measurement of the SCR, in which the current at the anode terminal is ramped from, for example, 0 to 100 mA and computer system 20 acquires DC snapback characteristic data for the SCR, such as the voltage and current between the anode and cathode, while the current is being ramped up. Additionally, computer system 20 can perform a voltage force measurement, in which the voltage at the anode terminal is ramped from, for example, −2 to 12 volts DC and computer system 20 acquires DC snapback characteristic data for the SCR, such as the voltage and current between the anode and cathode, while the voltage is being ramped up. Furthermore, computer system 20 can perform a TLP test using varying pulses (e.g., 100 ns, 30 ns, 1 ns) on the physical SCR to acquire TLP characteristic data for the physical SCR.

In process P2, computer system 20 can perform model parameter extraction for the DC snapback-related parameters of the snapback behavior model 44 using the DC snapback characteristic measurement data and TLP characteristic data acquired in process P1. To this extent, computer system 20 can adjust the snapback parameters of snapback behavior model 44 to fit the DC snapback characteristic measurement data and TLP characteristic data for the SCR. For example, computer system 20 can use the data to fit the parameters of a mathematical formula of the snapback behavior model 44 used to simulate the snapback behavior of the SCR. Computer system 20 can use one or more plots of simulated behavior in conjunction with the TLP characteristic data to fit the parameters of the mathematical formula of the snapback behavior model 44. In an embodiment, the snapback behavior model 44 includes multiple sets of parameters for the mathematical formula, each of which fits the behavior of an SCR for a unique type of electrostatic discharge event. For example, a first set of parameters can be selected to simulate a human body model (HBM) electrostatic discharge event (e.g., 100 ns TLP), another set of parameters can be selected to simulate a machine model electrostatic discharge event (e.g., 30 ns TLP), etc. In this case, when a particular type of electrostatic discharge event is to be simulated using the snapback behavior model 44, the corresponding set of parameters for the snapback behavior model 44 can be selected and utilized.

After the SCR component model 42 parameters have also been adjusted to provide an accurate simulation of the behavior of a physical embodiment of the SCR, in process P3, computer system 20 can combine the SCR component model 42 and the snapback behavior model 44 to verify that the combined models 42, 44 accurately simulate all of the behavior attributes of the physical SCR. For example, computer system 20 can perform data fitting of the combined models 42, 44 to ensure that the resulting outputs accurately simulate the measurement data acquired for the physical SCR.

Although the fitting of the behavior model 44 described herein has been shown and described with reference to a single component (e.g., a single SCR), it is understood that the behavior model 44 can be fitted based on measurement data acquired for multiple components. For example, measurement data for a statistically significant sample size of components of a particular technology can be combined (e.g., averaged) to provide a set of typical performance attributes for a component. Similarly, multiple behavior models 44 can be fitted for components manufactured using different technologies, different geometries, and/or the like, and the behavior models 44 can be used to compare the behavior of the different components when implemented in different circuits.

As discussed herein, behavior model 44 can be included in a circuit model 40 (FIG. 1) of a circuit comprising various components including at least one component that exhibits behavior, such as snapback behavior, that is difficult to model using a physical representation of the component. In an embodiment, the component exhibits the snapback behavior, and is implemented as part of an ESD protection circuit for a larger circuit. For example, the component can comprise an SCR in two- or four-terminal configuration.

Figure 7:
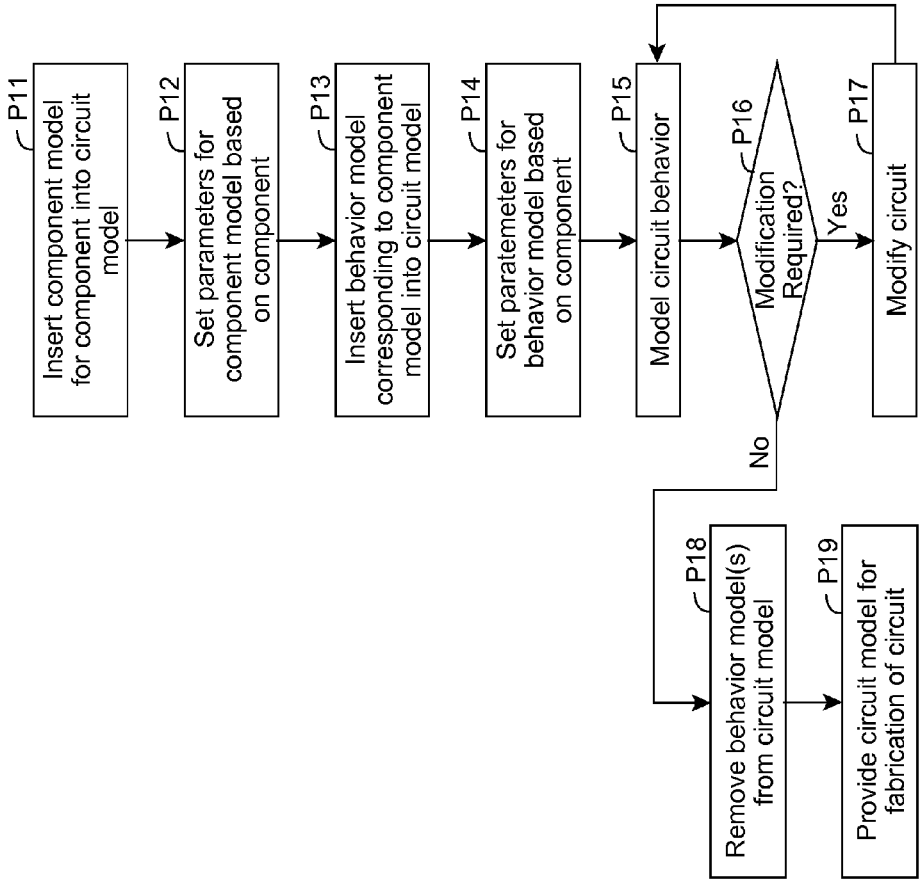
FIG. 7 shows an illustrative process for generating a circuit according to an embodiment.

FIG. 7 shows an illustrative process for generating a circuit according to an embodiment. Referring to FIGS. 1 and 7, in process P11, computer system 20 can receive a request from a user 12 to insert an instance of a component model 42 for a component into a circuit model 40 being generated for modeling the circuit. The request can include interconnection data for one or more inputs and/or outputs for the component model 42, which the user 12 can select according the desired functionality to be provided by the component within the circuit. In process P12, computer system 20 can receive values from a user 12 for one or more parameters that can be used to customize the instance of the component model 42 for the particular component that will be implemented within the circuit. For example, illustrative parameters can include leakage current, junction capacitance, and/or the like.

As discussed herein, the component being modeled using the component model 42 can exhibit a behavior, such as snapback behavior, which can be modeled using a plug in behavior model 44. To this extent, in process P13, computer system 20 can receive a request from a user 12 to insert an instance of the behavior model 44 corresponding to the component model 42 into the circuit model 40. The request can include interconnection data for an input and an output of the behavior model 44 that places the behavior model 44 in parallel or in series with the component model 42. In process P14, computer system 20 can receive values from a user 12 for one or more parameters that can be used to customize the instance of the behavior model 44 that is being used to model the behavior, such as snapback behavior, for the particular component. For example, illustrative parameters for a snapback behavior model can include trigger voltage, trigger current, on-state resistance, and/or the like. It is understood that processes P11-P14 can be performed any number of times during the generation of a particular circuit model 40 for any number of components being modeled using circuit model 40. Additionally, it is understood that additional instances of component models 42 of other components in the circuit typically will be added to generate the circuit model 40.

In any event, once circuit model 40 is complete, in process P15, computer system 20 can model the circuit behavior. Modeling the circuit behavior can include applying various signals to inputs of the circuit to determine whether the desired outputs are generated, simulating transient events to determine whether an ESD protection circuit functions properly and/or interferes with circuit behavior, and/or the like. In process P16, computer system 20 can determine whether one or more modifications are required for the circuit. For example, the user 12 can request to make one or more modifications to component model(s) 42 within the circuit model 40 based on aspects of the circuit behavior that were not desirable. In process P17, computer system 20 can receive the modification(s) to the circuit model 40 and processing can return to process P15.

Once the circuit model 40 indicates that the circuit will behave as desired, processing can proceed to process P18, in which computer system 20 can remove the behavior model(s) 44 form the circuit model 40. In particular, since the physical component that corresponds to a behavior model 44 is already modeled in the circuit model 40 with a corresponding component model 42, the behavior models 44 have no separate physical component that will be present when a physical implementation of the circuit is fabricated. In process P19, computer system 20 can provide the circuit model 40 for use in fabricating the circuit, e.g., by transmission of the circuit model 40 to a fabrication system, storage of the circuit model 40 for later use, and/or the like.

While shown and described herein as a behavior model 44 and a method and system for modeling circuit behavior, such as snapback behavior of a circuit component in the circuit, it is understood that aspects of the invention further provide various alternative embodiments. For example, in one embodiment, the invention provides a computer program fixed in at least one computer-readable medium, which when executed, enables a computer system to simulate a circuit including a component that exhibits behavior, such as snapback behavior, using the behavior model 44. To this extent, the computer-readable medium includes program code, such as modeling program 30 and behavior model 44, which implements some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

Figure 8:
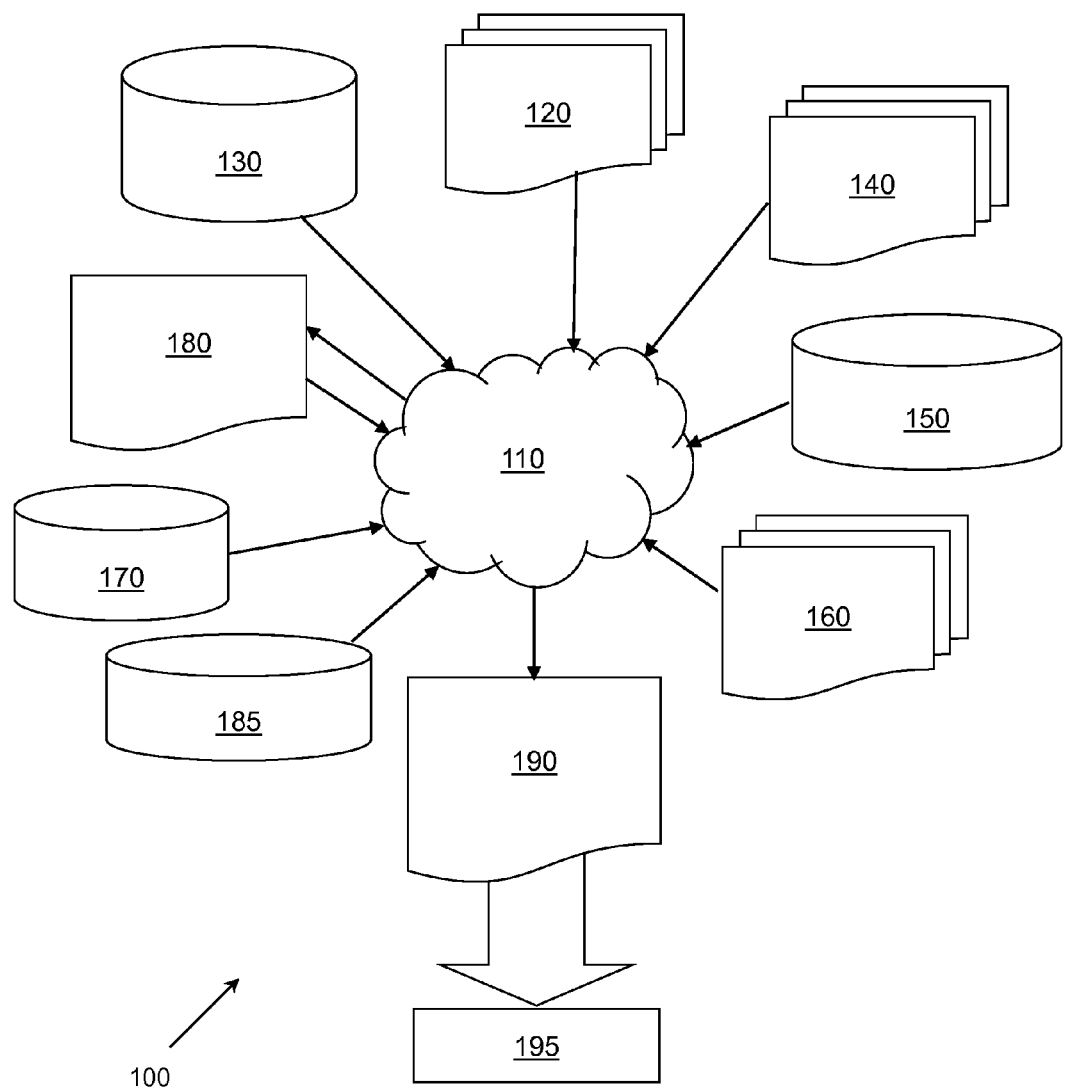
FIG. 8 shows a flow diagram of an illustrative design process used in semiconductor design, manufacturing, and/or test according to an embodiment.

In another embodiment, the circuit model 40, which includes at least one instance of a behavior model 44, is utilized to evaluate a circuit, e.g., as part of a computerized process for designing, manufacturing and/or testing the circuit. To this extent, FIG. 8 shows a flow diagram of an illustrative design process, which can be implemented by computer system 20 (FIG. 1), and used in semiconductor design, manufacturing, and/or test according to an embodiment.

Design flow 100 may vary depending on a type of integrated circuit (IC) being designed. For example, a design flow 100 for building an application specific IC (ASIC) may differ from a design flow 100 for designing a standard component. Design structure 120 is preferably an input to a design process 110 and may come from an intellectual property (IP) provider, a core developer, or other design company or may be generated by the operator of the design flow, or from other sources. Design structure 120 comprises a set of instructions defining a circuit, such as circuit model 40, component model 42, and/or behavior model 44 of FIG. 1, in the form of schematics, a hardware-description language (HDL, such as Verilog, VHDL, C, etc.), and/or the like. Design structure 120 can be embodied on one or more computer-readable media. For example, design structure 120 can be embodied as a text file, a graphical representation of a circuit, and/or the like, which is stored on a computer-readable storage medium. Design process 110 can synthesize (or translate) design structure 120 into a netlist 180, where netlist 180 is, for example, a list of wires, transistors, logic gates, control circuits, I/O, models, etc., which describes the connections to other elements and circuits in an integrated circuit design. Netlist 180 can be embodied on at least one computer-readable medium. Generation of netlist 180 can be an iterative process in which netlist 180 is re-synthesized one or more times depending on design specifications and/or parameters for the circuit.

Design process 110 can use a variety of inputs. For example, design process 110 can use inputs from library elements 130, which can comprise a set of commonly used elements, circuits, and devices, including models (e.g., component model(s) 42 and/or behavior model 44), layouts, and symbolic representations, for a given manufacturing technology (e.g., different technology nodes, 32 nm, 45 nm, 90 nm, etc.), design specifications 140, characterization data 150, verification data 160, design rules 170, and test data files 185 (which can include test patterns and other testing information). Design process 110 can further include, for example, standard circuit design processes such as timing analysis, verification, design rule checking, place and route operations, etc. One of ordinary skill in the art of integrated circuit design can appreciate the extent of possible electronic design automation tools and applications used in design process 110 without deviating from the scope and spirit of the invention. The design structure of the invention is not limited to any specific design flow.

In an embodiment, design process 110 can translate design structure 120, along with the remainder of the integrated circuit design (if applicable), into a final design structure 190 (e.g., information embodied on a storage medium). Final design structure 190 can comprise information such as, for example, test data files, design content files, manufacturing data, layout parameters, wires, levels of metal, vias, shapes, test data, data for routing through the manufacturing line, and any other data required by a semiconductor manufacturer to produce a physical embodiment of the corresponding circuit. Final design structure 190 can be utilized in a stage 195, in which, for example, final design structure 190: is provided for tape-out, is released to manufacturing, is sent to another design house, is sent back to a customer, and/or the like.

In another embodiment, the invention provides a method of providing a copy of program code, such as modeling program 30, circuit model 40, behavior model 44, and/or the like, which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for developing the circuit model 40. In this case, a computer system, such as computer system 20 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method comprising:
   generating a simulation circuit model for a circuit using a computer system including at least one computing device, the generating including:
      adding a component model for a component of the circuit to the simulation circuit model, wherein the component is a semiconductor device; and
      adding a behavior model to the simulation circuit model, wherein the behavior model is located in parallel or in series with the component model and comprises a mathematical formula corresponding to a set of behavioral characteristics of the component, wherein the behavior model and the component model are configured to collectively simulate the behavior of the component within the circuit, and wherein the behavior model does not add a physical component to the simulation circuit model; and
   storing the simulation circuit model on the computer system.

2. The method of claim 1, further comprising simulating operation of the circuit on the computer system using the simulation circuit model.

3. The method of claim 2, further comprising providing a fabrication the circuit model for use in fabricating the circuit, wherein the fabrication circuit model is based on the simulation circuit model and includes the component model and does not include the behavior model.

4. The method of claim 1, wherein the behavior model simulates snapback behavior exhibited by the component.

5. The method of claim 4, wherein the component model comprises a physical circuit model of the component.

6. The method of claim 4, wherein the mathematical formula maintains continuity between an off state and an on state of the component.

7. The method of claim 4, wherein the component is one of: a reverse bias diode, a field effect transistor or a silicon controlled rectifier.

8. The method of claim 1, further comprising setting a set of parameters for the behavior model based on at least one of: direct current (DC) measurement data or transmission line pulse (TLP) measurement data for the component.

9. A computer-implemented method comprising:
   obtaining a simulation circuit model for a circuit on a computer system including at least one computing device, the simulation circuit model including a component model for a component of the circuit and a behavior model corresponding to the component model, wherein the behavior model is located in parallel or in series with the component model and comprises a mathematical formula corresponding to a set of behavioral characteristics of the component, wherein the behavior model and the component model are configured to collectively simulate the behavior of the component within the circuit, and wherein the behavior model does not add a physical component to the simulation circuit model, and wherein the component is a semiconductor device; and
   simulating operation of the circuit on the computer system using the simulation circuit model.

10. The method of claim 9, further providing a fabrication circuit model for use in fabricating the circuit, wherein the fabrication circuit model is based on the simulation circuit model and includes the component model and does not include the behavior model.

11. The method of claim 9, wherein the behavior model simulates snapback behavior exhibited by the component.

12. The method of claim 11, wherein the component model comprises a physical circuit model of the component, and wherein the component is one of: a reverse bias diode, a field effect transistor, or a silicon controlled rectifier.

13. The method of claim 9, further comprising setting a set of parameters for the behavior model based on at least one of: direct current (DC) measurement data or transmission line pulse (TLP) measurement data for the component prior to the simulating.

14. The method of claim 13, wherein the behavior model simulates snapback behavior exhibited by the component and wherein the set of parameters include: a snapback voltage, a holding current, and a holding voltage.

15. A computer system comprising:
a set of computing devices configured to implement a method comprising:
generating a simulation circuit model for a circuit, the generating including:
adding a component model for a component of the circuit to the simulation circuit model, wherein the component is a semiconductor device; and
adding a behavior model to the simulation circuit model, wherein the behavior model is located in parallel or in series with the component model and comprises a mathematical formula corresponding to a set of behavioral characteristics of the component, wherein the behavior model and the component model are configured to collectively simulate the behavior of the component within the circuit, and wherein the behavior model does not add a physical component to the simulation circuit model.

16. The system of claim 15, the method further comprising simulating operation of the circuit using the simulation circuit model.

17. The system of claim 16, the method further comprising providing a fabrication circuit model for use in fabricating the circuit, wherein the fabrication circuit model is based on the simulation circuit model and includes the component model and does not include the behavior model.

18. The system of claim 15, wherein the behavior model simulates snapback behavior exhibited by the component.

19. The system of claim 15, the method further comprising setting a set of parameters for the behavior model based on at least one of: direct current (DC) measurement data or transmission line pulse (TLP) measurement data for the component.

20. A computer system comprising:
a set of computing devices configured to implement a method comprising:
obtaining a simulation circuit model for a circuit, the simulation circuit model including a component model for a component of the circuit and a behavior model corresponding to the component model, wherein the behavior model is located in parallel or in series with the component model and comprises a mathematical formula corresponding to a set of behavioral characteristics of the component, wherein the behavior model and the component model are configured to collectively simulate the behavior of the component within the circuit, and wherein the behavior model does not add a physical component to the simulation circuit model and wherein the component is a semiconductor device; and
simulating operation of the circuit on the computer system using the simulation circuit model.

21. The system of claim 20, the method further comprising providing a fabrication circuit model for use in fabricating the circuit, wherein the fabrication circuit model is based on the simulation circuit model and includes the component model and does not include the behavior model.

22. The system of claim 20, wherein the behavior model simulates snapback behavior exhibited by the component.

23. The system of claim 20, the method further comprising setting a set of parameters for the behavior model based on at least one of: direct current (DC) measurement data or transmission line pulse (TLP) measurement data for the component prior to the simulating.

24. A computer program product stored on at least one non-transitory computer-readable medium having program code, which when executed, enables a computer system to implement a method comprising:
generating a simulation circuit model for a circuit, the generating including:
adding a component model for a component of the circuit to the simulation circuit model, wherein the component is a semiconductor device; and
adding a behavior model to the simulation circuit model, wherein the behavior model is located in parallel or in series with the component model and comprises a mathematical formula corresponding to a set of behavioral characteristics of the component, wherein the behavior model and the component model are configured to collectively simulate the behavior of the component within the circuit, and wherein the behavior model does not add a physical component to the simulation circuit model.

25. The computer program product of claim 24, the method further comprising simulating operation of the circuit using the simulation circuit model.

* * * * *